(12) United States Patent
Lee (10) Patent No.: US 7,675,064 B2
(45) Date of Patent: Mar. 9, 2010

(54) PIXEL UNIT STRUCTURE OF SELF-ILLUMINATION DISPLAY WITH LOW-REFLECTION

(75) Inventor: Chung-Chun Lee, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 134 days.

(21) Appl. No.: 11/668,056

(22) Filed: Jan. 29, 2007

(65) Prior Publication Data

US 2008/0042136 A1 Feb. 21, 2008

(30) Foreign Application Priority Data

Aug. 16, 2006 (TW) .............................. 95130100 A (51) Int. Cl.
*H01L 29/04* (2006.01)
*H01L 29/10* (2006.01)

(52) U.S. Cl. .............................. 257/59; 257/57; 257/72

(58) Field of Classification Search .................. 257/40, 257/57, 59, 72, E51.018, E51.019, E51.02, 257/E51.021, E51.022, E51.026, E33.067, 257/E33.068, E33.069, E33.072

See application file for complete search history.

(56) References Cited

U.S. PATENT DOCUMENTS

| | | | |
|---|---|---|---|
| 5,986,401 | A | 11/1999 | Thompson et al. |
| 6,392,340 | B2 | 5/2002 | Yoneda et al. |
| 6,515,428 | B1 | 2/2003 | Yeh et al. |
| 6,721,023 | B1 | 4/2004 | Weiss et al. |
| 6,781,152 | B2 * | 8/2004 | Yamazaki ..................... 257/59 |
| 6,838,828 | B2 | 1/2005 | Joo et al. |
| 2003/0090204 | A1 | 5/2003 | Joo et al. |
| 2005/0005848 | A1 * | 1/2005 | Yamazaki et al. ........... 118/719 |
| 2005/0139839 | A1 | 6/2005 | Park |

(Continued)

FOREIGN PATENT DOCUMENTS

CN 1417833 5/2003

(Continued)

OTHER PUBLICATIONS

Chinese language office action dated Mar. 21, 2008.

(Continued)

*Primary Examiner*—Hung Vu
(74) *Attorney, Agent, or Firm*—Thomas, Kayden, Horstemeyer & Risley (57) ABSTRACT

A self-illumination display is provided, including a first substrate, a light-absorbing structure, a filter layer, a driving circuit unit, and a self-illumination unit. The light-absorbing structure and the filter layer are juxtaposedly disposed over the first substrate. The driving circuit unit is disposed over and shielded by the light-absorbing structure. The self-illumination unit is disposed over the filter layer, including a light-transmissible electrode, a light emitting layer, and a black electrode. The self-illumination unit is disposed over the filter layer, including a light-transmissible electrode, a light emitting layer, and a black electrode. The light-transmissible electrode is disposed over the filter layer while the light emitting layer and the black electrode are sequentially tiered on the light-transmissible electrode. The light-absorbing structure, the filter layer and the black electrode together reduce the reflection of the ambient light and enhance the image contrast.

11 Claims, 6 Drawing Sheets

U.S. PATENT DOCUMENTS

2005/0139849 A1   6/2005   Ko

FOREIGN PATENT DOCUMENTS

| CN | 1553527 | 12/2004 |
| CN | 1638562 | 7/2005 |
| EP | 1 308 982 | 1/2007 |
| TW | 587395 | 5/1991 |
| TW | 200304100 | 2/1992 |

OTHER PUBLICATIONS

English language translation of abstract of CN 1417833.
English language abstract for TW 00466888.
English language abstract for JP 2002-216960.
Chinese language Office Action dated Nov. 2, 2007.
English language translation of abstract of CN 1553527.

* cited by examiner

PIXEL UNIT STRUCTURE OF SELF-ILLUMINATION DISPLAY WITH LOW-REFLECTION

BACKGROUND OF THE INVENTION

1. Field of the Invention

The present invention generally relates to a pixel unit structure of a self-illumination display, and more particularly to a pixel unit structure of a self-illumination display with low-reflection.

2. Description of the Prior Art

As the purchasing demand of the slim displays increases day after day, the development of the self-illumination display technique is become more and more important. The technique of the self-illumination display, such as organic light emitting diode (OLED), is now well developed. For example, for the organic light emitting diode, the illumination of the display panel is the main consideration to determine whether the display device is good or not. In the display field, how to efficiently increase the utilizing rate of the self-illumination display is the main target for the engineers.

In regards to the contrast of the display panel, when the contrast is higher, the color and the image performance of the display panel is desirable. However, in the way of enhancing the contrast, the method is to increase the illumination of the self-illumination unit and isolate the reflection of the light from the external environment. Since the light from the external environment can enter the display panel through the display surface and then reflect by the electrode or the transistor within the display panel back to the display surface, the reflective light will affect the performance of the light generated from the display panel and the contrast of the display panel will be reduced. Therefore, how to reduce the reflection of the external environment light is the main issue in the development of the display panel.

Figure 1:
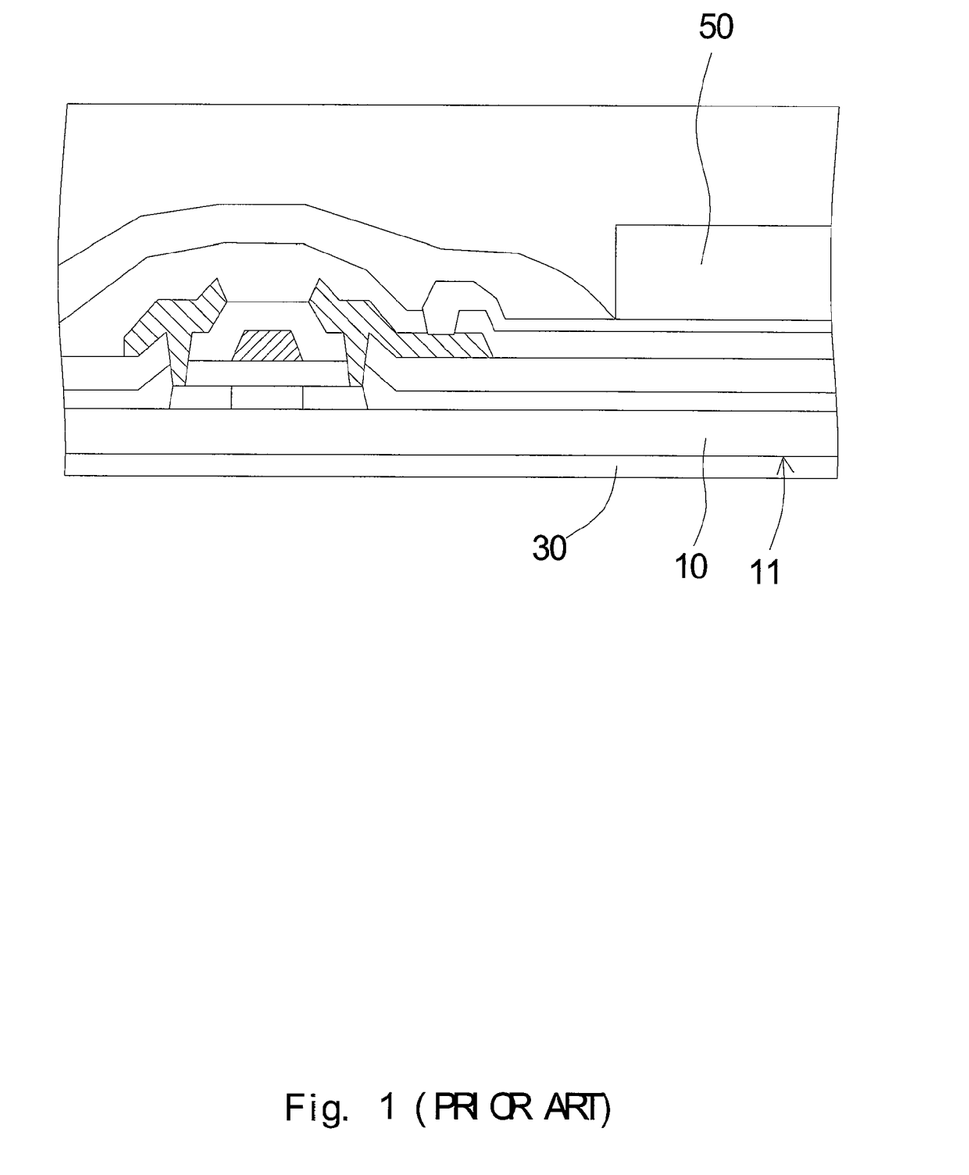
FIG. 1 shows a cross-sectional view of a light emitting diode display panel in the prior art.

As shown in FIG. 1, in order to reduce the reflective rate of the display panel, a polarizing film 30 is installed in the external surface 11 of the substrate 10 of the display panel. When the polarizing film 30 with the low transmitting rate is used, the reflective rate is reduced and the contrast is enhanced. However, the lost of the illumination is needed to recover; therefore the illuminative rate of the self-illumination element 50 must be increased. Yet, in this case, the lifetime of the self-illumination element 50 is reduced. As the polarizing film 30 with the high transmitting rate is used, the utilizing rate of the light is better but the efficiency of the contrast is decreased.

SUMMARY OF THE INVENTION

One purpose of the present invention is to provide a pixel unit structure of a self-illumination display which has a low external environment light reflective rate.

Another purpose of the present invention is to provide a pixel unit structure of a self-illumination display which has better contrast performance.

The other purpose of the present invention is to provide a pixel unit structure of a self-illumination display which has a better utilizing rate for the illumination.

The pixel unit structure of the self-illumination display includes a first substrate, a light-absorbing structure, a filter layer, a driving circuit and a self-illumination unit. The first substrate is used to be the base board of the display panel and includes an illuminative region and a non-illuminative region. The light-absorbing structure is formed over the first substrate and disposed within the non-illuminative region. By the installation of the light-absorbing structure, the amount of the external environment light to the non-illuminative region of the first substrate is reduced. Therefore, the reflective light caused by the external environment light reflected from the circuit or the electronic components is reduced.

The filter layer is disposed over the first substrate and close to the light-absorbing structure. Because of the isolation of the filter layer, the amount of the external environment light emitted into the first substrate is reduced and the contrast of the image shown on the self-illumination display is enhanced. The driving circuit is disposed over the light-absorbing structure and sheltered by the light-absorbing structure. In other words, the external environment light emitted into the first substrate is hard to contact with the driving circuit components. Therefore, the probability that the external environment light reflected from the driving circuit or the metal material thereof is reduced.

The self-illumination unit is disposed over the filter layer and substantially corresponding to the illuminative region of the first substrate. The self-illumination unit includes a light-transmissible electrode layer, a light emitting layer and a black electrode layer. The light-transmissible electrode layer is formed over the filter layer and is made of the light-transmissible and conductive material. The light emitting layer and the black electrode layer are sequentially formed over the light-transmissible electrode layer. Because the reflection of the black electrode layer is lower than the common metal electrode, the reflective light generated by the black electrode layer is lower than the reflective light generated by the common metal electrode when the external environment light emits into the black electrode layer through the first substrate and the filter layer. When the reflective light is reduced, the light generated by the self-illumination unit is able to enhance the contrast of the image. Besides, by the installation of the light-absorbing structure, the filter layer and the black electrode layer, it is more efficient to reduce the amount of the reflective light generated by the external environment light and the contrast of the display device is enhanced.

DETAILED DESCRIPTION OF THE PREFERRED EMBODIMENT

A pixel unit structure of a self-illumination display is disclosed in the present invention. In the preferred embodiment, the self-illumination display of the present invention is a color organic light emitting diode (OLED) display. In a different embodiment, the self-illumination display of the present invention is a monochromatic OLED display. Besides, in other embodiment, the self-illumination display of the present invention is a polymer light emitting diode (PLED) display. The self-illumination display of the present invention can be used in any display panels, home used flat panel TV, flat panel monitor for desktop or laptop, or display screen for mobile phone or digital camera.

Figure 2:
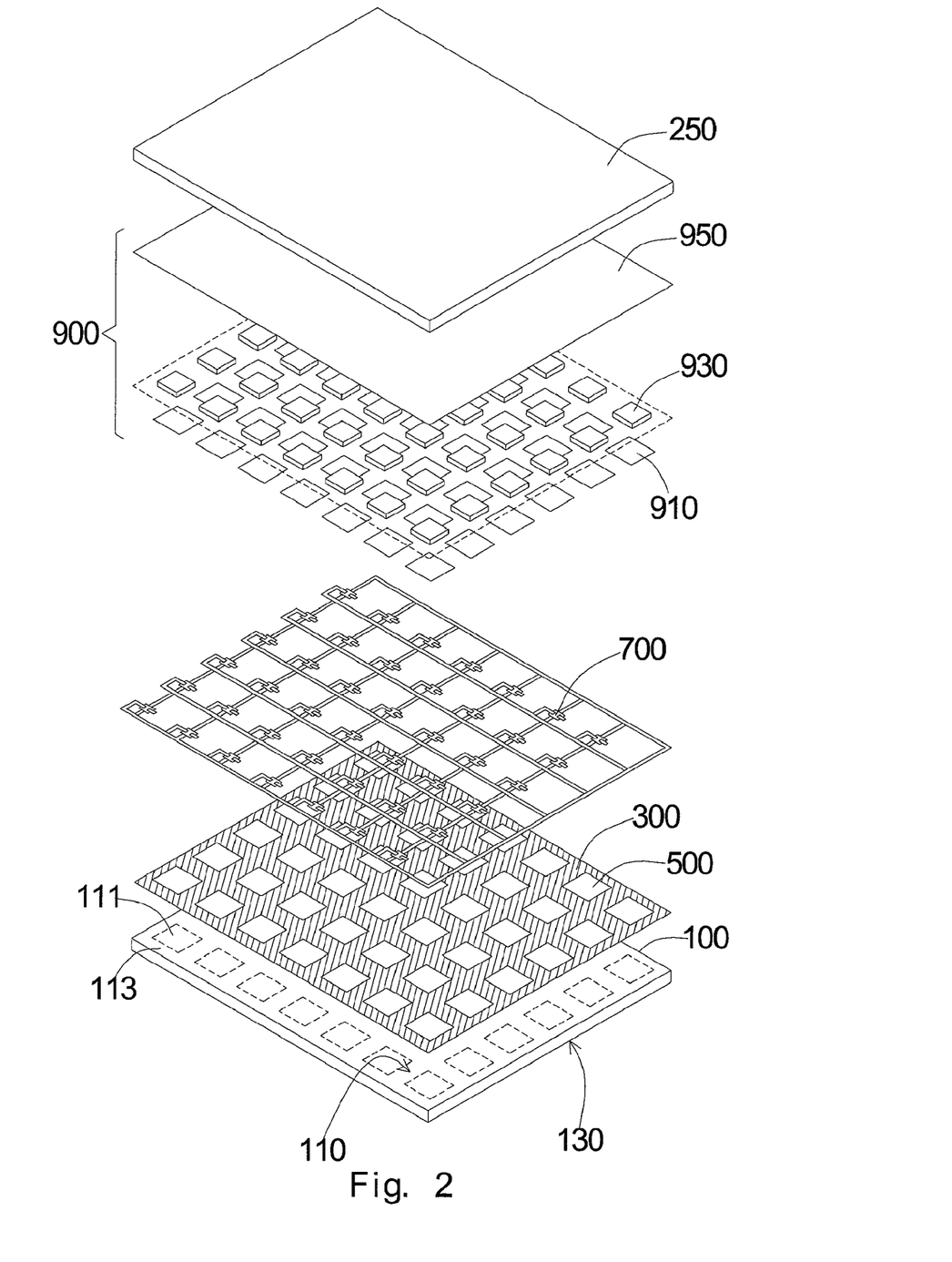
FIG. 2 illustrates an exploded view of the self-illumination display according to one embodiment of the present invention.

As the preferred embodiment shown in FIG. 2, the pixel unit structure of the self-illumination display includes a first substrate 100, a light-absorbing structure 300, a filter layer 500, a driving circuit 700, a self-illumination unit 900 and a backside substrate 250. In the present embodiment, the first substrate 100 is the base board for the display panel. The light is emitted out through the first substrate 100 to display the images. The material of the first substrate 100 is made by the transparent materials, such as glass or organic material with polymers. Besides, in the present embodiment, the first substrate 100 is divided into an illuminative region 111 and a non-illuminative region 113.

The light-absorbing structure 300 is formed over the first substrate 100 and disposed within the non-illuminative region 113. In the preferred embodiment, the light-absorbing structure 300 fully covers the non-illuminative region 113. In a different embodiment, the light-absorbing structure 300 covers a portion of the non-illuminative region 113. By disposing the light-absorbing structure 300, the light from the external environment enters into the non-illuminative region 113 of the first substrate 100 is reduced. Therefore, the reflective light caused by the circuit or the electronic device reflecting the external environment light is reduced. In the preferred embodiment, the light-absorbing structure 300 is a dark light-absorbing structure and includes black matrix. The structure of the black matrix can be a single-layered organic film, a single-layered non-organic film, a compound organic film, a compound non-organic film and etc. In the preferred embodiment, the black matrix is a chromium (Cr) black matrix. In a different embodiment, the black matrix is a resin black matrix, a graphite black matrix or any other materials with similar structure.

Figure 3:
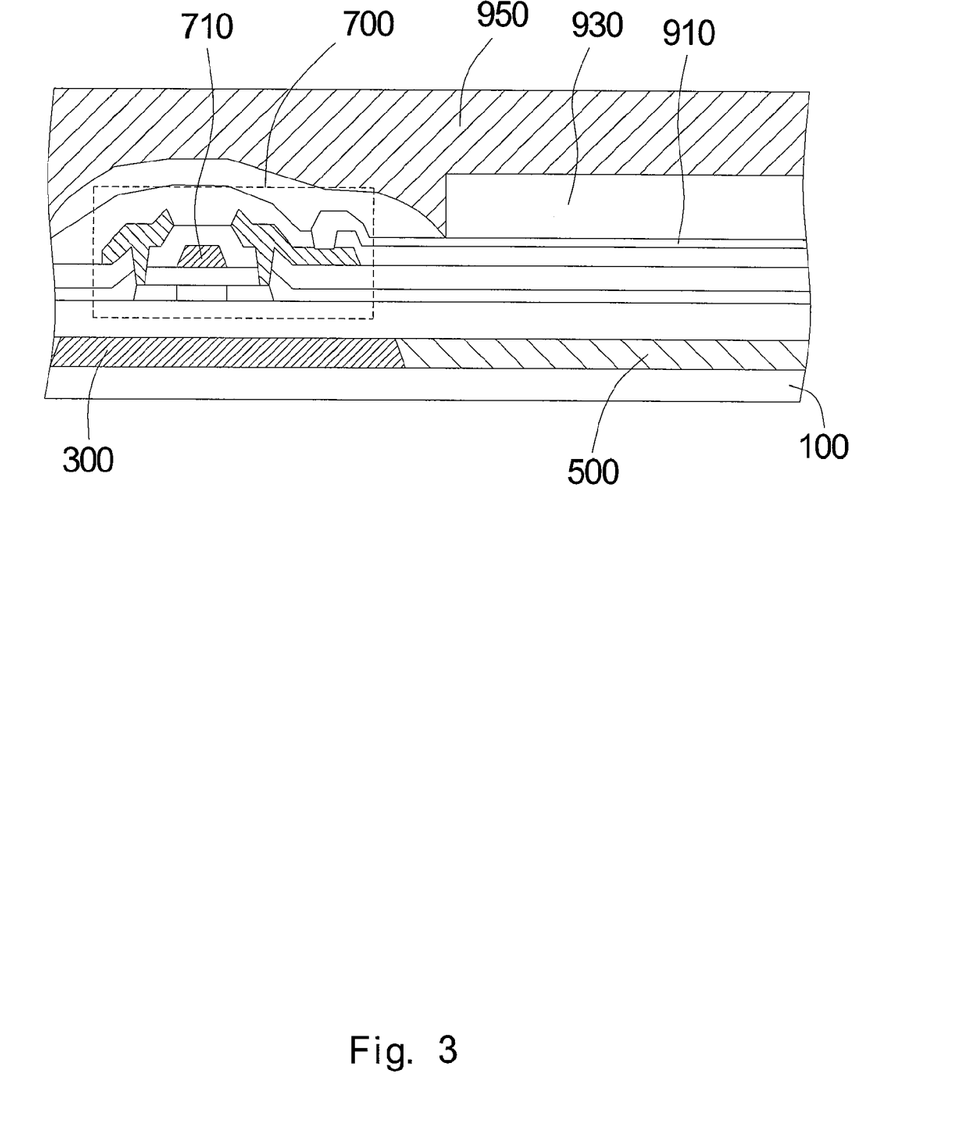
FIG. 3 shows a cross-sectional view of the pixel unit structure of the self-illumination display according to one embodiment of the present invention.

As the embodiment shown in FIG. 3, the filter layer 500 is disposed over the first substrate 100 and is close to the light-absorbing structure 300. In this preferred embodiment, the filter layer 500 is disposed over the illuminative region 111 and one side of the filter layer 500 is connected to the light-absorbing structure 300. The filter layer 500 fully covers the illumination region 111. In a different embodiment, the filter layer 500 covers a portion of the illumination region 111. In this embodiment, the filter layer 500 is a color filter. However, the filter layer 500 can also be the filter photoresist, directly formed over the first substrate 100, such as Color Filter on Array. Because of the isolation of the filter layer 500, the light from the external environment enters into the first substrate 100 is reduced to enhance the contrast of the self-illumination display. Besides, due to install the filter layer 500 and the light-absorbing structure 300, it is more efficient to reduce the reflective light caused by the external environment light to enhance the contrast of the display panel.

As shown in FIG. 3, the driving circuit 700 is disposed over the light-absorbing structure 300. The light-absorbing structure 300 shelters the driving circuit 700 from the light emitted through the first substrate 100. Therefore, the driving circuit 700 is isolated from the external environment light which avoids the external environment light reflected from the driving circuit 700 or other metal materials to the first substrate 100. As the preferred embodiment shown in FIG. 4, the light-absorbing structure 300 shelters the vertical projection of the driving circuit 700 on the first substrate 100 and the better sheltering result is achieved. The driving circuit 700 includes thin-film-transistor (TFT). In a different embodiment, the driving circuit 700 includes a different circuit with same functions, such as a metal isolator metal thin film diode (MIM-TFD) circuit. The method of forming TFT includes amorphous silicon (a-Si) process, low temperature poly-silicon (LTPS) process or other processes with same functions. Besides, the gate 710 of the driving circuit 700 in each pixel unit is electrically connected to the adjacent driving circuit 700.

Figure 4:
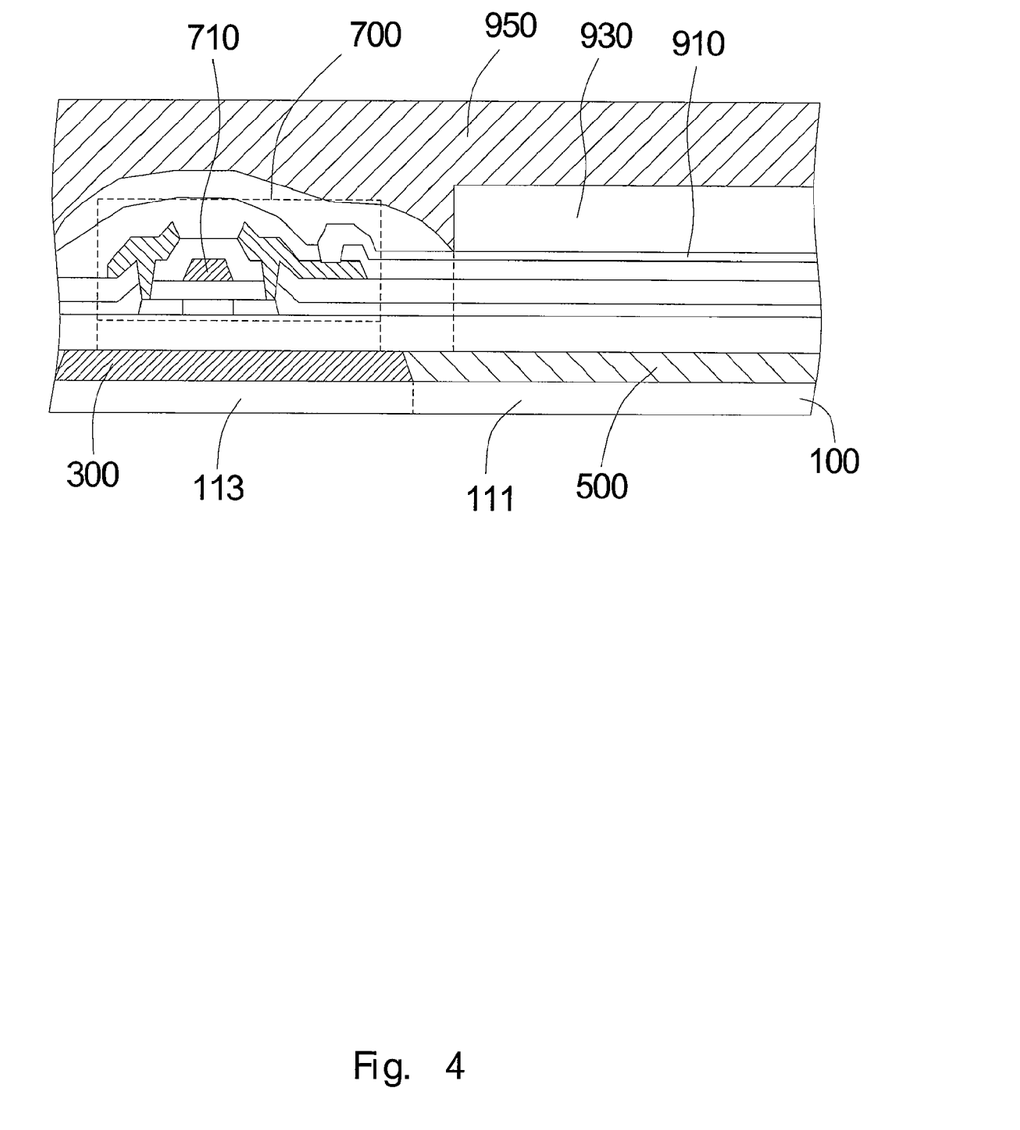
FIG. 4 illustrates a view of the projection position of the exemplary self-illumination display according to the present invention.

As the embodiment shown in FIG. 3, the self-illumination unit 900 is disposed over the filter layer 500 and substantially corresponding to the illuminative region 111 of the first substrate 100. On the other hand, the light generated by the self-illumination unit 900 is emitted from the illuminative region 111 to the outside of the first substrate 100. In the preferred embodiment, as shown in FIG. 4, the vertical projection of the self-illumination unit 900 of the first substrate 100 falls on the internal surface 110 of the illuminative region 111. The self-illumination unit 900 includes a light-transmissible electrode 910, a light emitting layer 930 and a black electrode layer 950. The light-transmissible electrode 910 is on the top of the filter layer 500 and is the anode of the self-illumination unit 900. As the embodiment shown in FIG. 3, the light-transmissible electrode 910 is formed directly over the filter layer 500 and is electrically connected to the driving 700. The light-transmissible electrode 910 includes the conductive layer formed by the indium tin oxide (ITO). In a different embodiment, the light-transmissible electrode 910 includes other light-transmissible conductive materials.

As shown in FIG. 3, the light emitting layer 930 is formed over the light-transmissible electrode 910. The light emitting layer 930 is formed by coating, physically or chemically depositing, yellow light, etching and so on. The light emitting layer 930 can include any self-illuminative materials. Besides, In the present embodiment, the light emitting layer 930 includes white light illuminative material and used with the filter layer 500 to generate different color light. In a different embodiment, the light emitting layer 930 includes any other different color light instead of white light.

The black electrode layer 950 is formed over the light emitting layer 930 and is used to be the cathode of the self-illumination unit 900. The black electrode layer 950 is formed by coating, physically or chemically depositing, yellow light, etching and so on. In the preferred embodiment, the black electrode layer 950 includes titanium (Ti) electrode. In a different embodiment, the black electrode layer 950 includes titanium alloy electrode, chromium electrode, chromium alloy electrode, graphite electrode or any other less reflective metal. Because the reflection of the black electrode layer 950 is less than the common metal electrode, as the reflected light is reduced, the image contrast generated from the self-illumination unit 900 is enhanced. Besides, due to the installation of the filter layer 500 and the light-absorbing structure 300, it is efficient to reduce the reflective light generated by the external environment light and enhance the effect of the contrast of the display.

Figure 5:
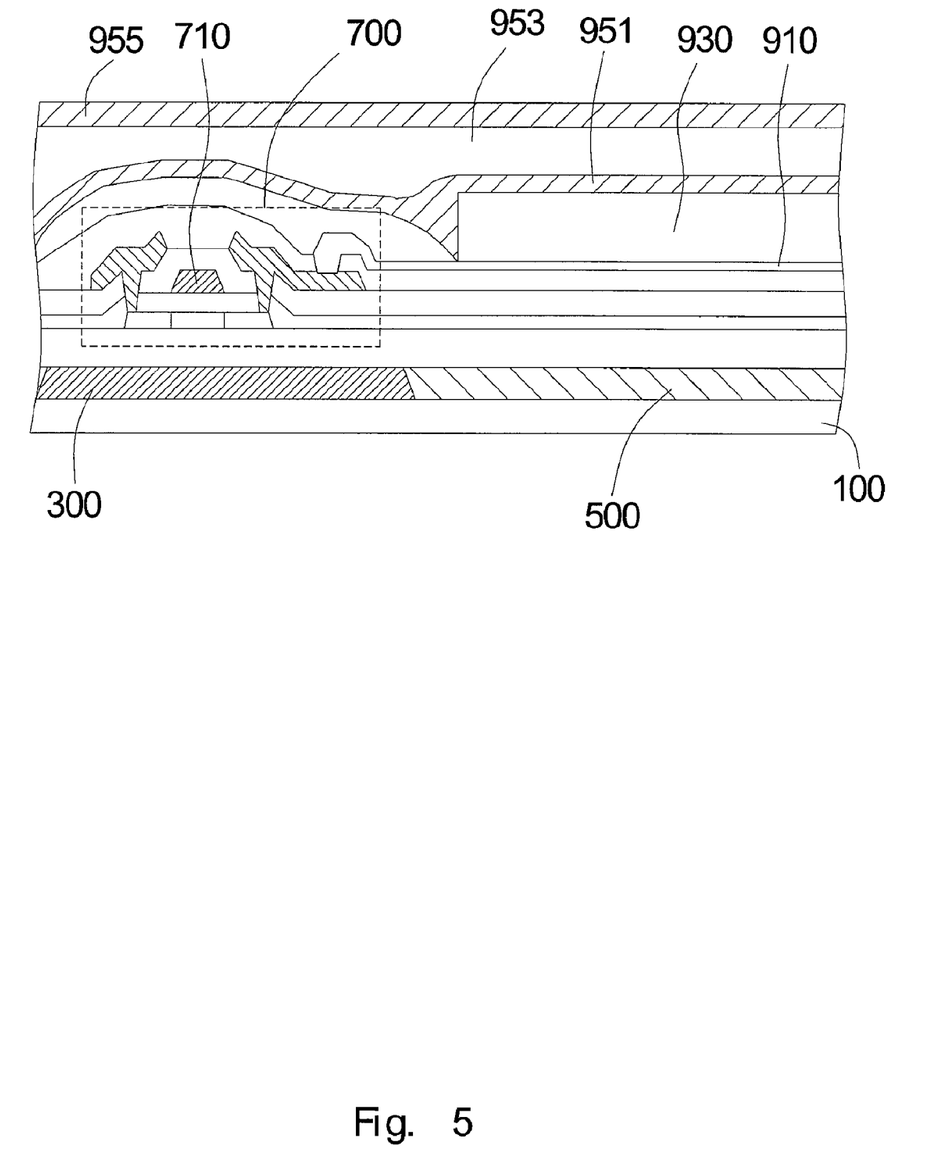
FIG. 5 illustrates another embodiment of the black electrode layer.

Another embodiment of the black electrode layer 950 is showing in FIG. 5. In the present embodiment, the black electrode layer 950 further includes a bottom metal electrode layer 951, a middle metal electrode layer 953 and a top metal electrode layer 955. The bottom metal electrode layer 951 is disposed over the light emitting layer 930. The thickness of the bottom electrode layer 951 is thinner and is about 1~25 nm thick. Therefore, the light is able to penetrate through the bottom electrode layer 951. The bottom metal electrode layer 951 is made by aluminum or aluminum alloy. In a different embodiment, the bottom metal electrode layer 951 is made by copper, any other conductive metal or metal alloy. The middle metal electrode layer 953 is light-transmissible and formed over the bottom metal electrode layer 951. In the preferred embodiment, the material of the middle metal electrode layer 953 is ITO. In a different embodiment, the material of the middle metal electrode layer 953 is any other conductive materials and is light-transmissible. The top metal electrode layer 955 is directly formed over the middle metal electrode layer 953. The material of the top metal electrode layer 955 is made by aluminum or aluminum alloy. Besides, the material of the top metal electrode layer 955 is the same as the material of the bottom electrode layer 951. In a different embodiment, the material of the top metal electrode layer 955 is copper or any other conductive metal alloy and is not the same as the material of the bottom metal electrode layer 953.

In the present embodiment, the bottom metal electrode layer 951, the middle metal electrode layer 953 and the top metal electrode layer 955 are together formed an optical chamber. Because the bottom metal electrode layer 951 is light-transmissible, the light emitted into the first substrate 100 is transmitted to the bottom metal electrode layer 951 and entered to the optical chamber. Because the optical effect is in the internal of the optical chamber, the light emitted into the optical chamber is hard to exit out of the bottom metal electrode layer 951 and it is able to reduce the reflective effect.

Figure 6:
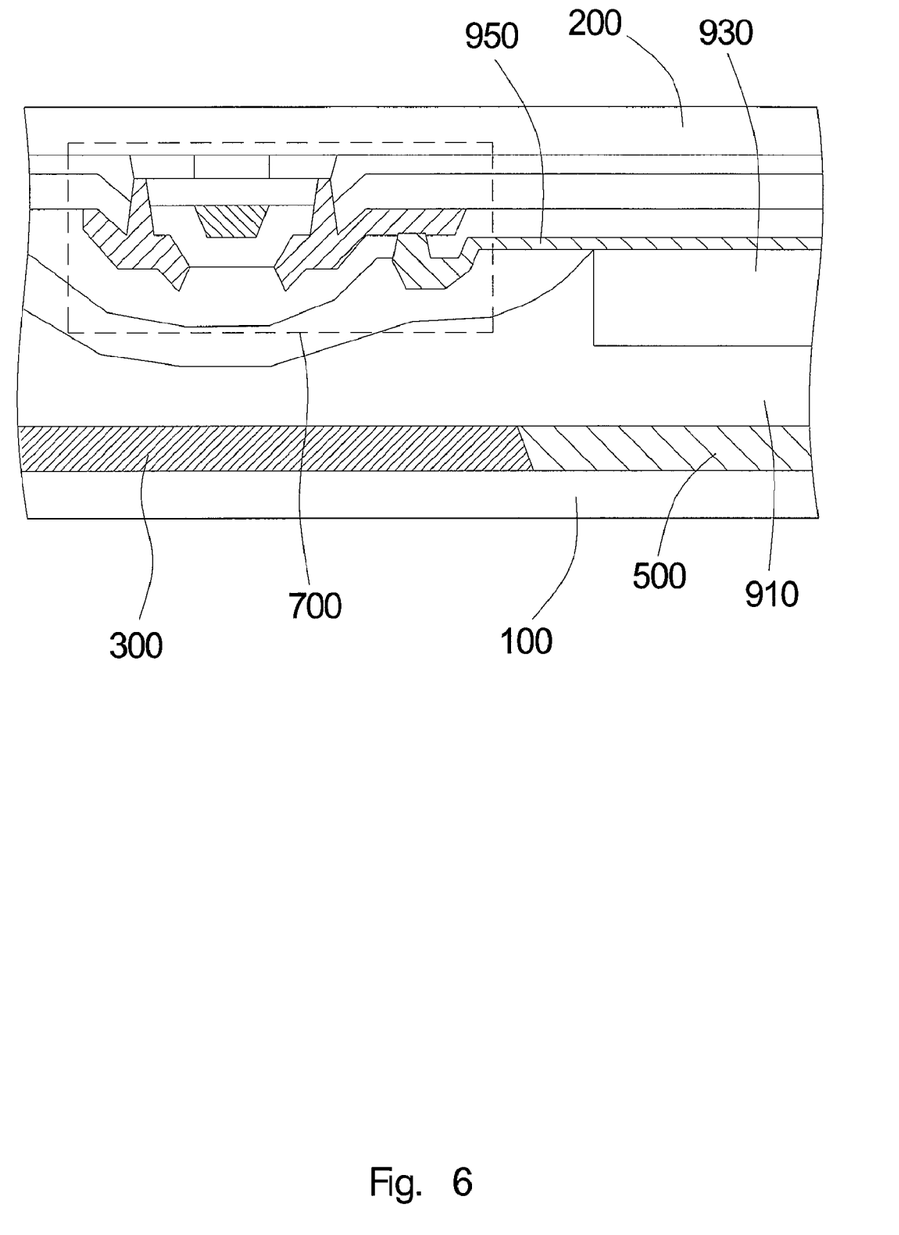
FIG. 6 illustrates a cross-sectional view of the self-illumination display according to another embodiment of the present invention.

As the embodiment shown in FIG. 3 and FIG. 5, the light generated by the self-illumination unit 900 passes through the anode of the light-transmissible electrode layer 910 and transmits out. As another embodiment shown in FIG. 6, the light generated by the self-illumination unit 900 transmits out through the cathode of the light-transmissible electrode layer 910. As shown in FIG. 6, the pixel unit structure of the self-illumination unit display further includes a second substrate 200 opposite to the first substrate 100. Alternatively, in accordance with the first substrate 100 of the display panel, the second substrate 200 is used to be a back board. The material of the second substrate 200 is metal, high polymer material or any other non-light-transmissible materials.

As shown in FIG. 6, the driving circuit 700 and the self-illumination 900 are sequentially formed over the second substrate 200. The light-absorbing structure 300 and the filter layer 500 are directly formed over the first substrate 100. When assembling the first substrate 100 and the second substrate 200, the light-absorbing structure 300 shelters the corresponding driving circuit 700. The self-illumination unit 900 is opposite to the filter layer 500. The black electrode layer 950 is used to be the anode and is electrically connected to the driving circuit 700. By installing the light-absorbing structure 300, the filter layer 500 and the black electrode layer 950, it is efficient to reduce the amount of the reflective light caused by the external environment lights and the contrast of the display is enhanced.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A pixel unit structure of a self-illumination display, comprising:
    a first substrate;
    a light-absorbing structure formed over the first substrate;
    a filter layer disposed over the first substrate and being close to the light-absorbing structure, wherein the filter layer allows light in a pre-determined wavelength range to pass through while the light-absorbing structure absorbs the light in the pre-determined wavelength range;
    a driving circuit disposed over the light-absorbing structure, wherein the light-absorbing structure shelters a vertical projection of the driving circuit on the first substrate; and
    a self-illumination unit including:
        a light-transmissible electrode layer formed over the filter layer;
        a light emitting layer formed over the light-transmissible electrode layer; and
        a black electrode layer formed over the light emitting layer, wherein the black electrode layer is light absorbable.

2. The pixel unit structure of claim 1, wherein the light-absorbing structure includes a black matrix.

3. The pixel unit structure of claim 1, wherein the filter layer includes a filter photoresist or a color filter.

4. The pixel unit structure of claim 1, wherein the light-transmissible electrode layer includes Indium Tin Oxide (ITO).

5. The pixel unit structure of claim 1, wherein the black electrode layer includes a titanium (Ti) electrode or a chromium (Cr) electrode.

6. The pixel unit structure of claim 1, wherein the black electrode layer comprises:
    a bottom metal electrode layer;
    a middle metal electrode layer formed over the bottom metal electrode layer; wherein the middle metal electrode layer is light-transmissible; and
    a top metal electrode layer formed over the middle metal electrode.

7. The pixel unit structure of claim 6, wherein the middle metal electrode layer is made of Indium Tim Oxide (ITO).

8. The pixel unit structure of claim 1, wherein the light-transmissible electrode layer is electrically connected to the driving circuit.

9. The pixel unit structure of claim 1, wherein the black electrode layer is a cathode layer.

10. The pixel unit structure of claim 1, wherein the light emitting layer includes a white illuminative material.

11. The pixel unit structure of claim 1, further comprising a second substrate opposite to the first substrate; wherein the driving circuit and the self-illumination unit are disposed between the first substrate and the second substrate.

* * * * *